(12) United States Patent
Carroll

(10) Patent No.: US 7,696,498 B2
(45) Date of Patent: Apr. 13, 2010

(54) ELECTRON BEAM LITHOGRAPHY METHOD AND APPARATUS USING A DYNAMICALLY CONTROLLED PHOTOCATHODE

(75) Inventor: Allen M. Carroll, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 358 days.

(21) Appl. No.: 11/686,905

(22) Filed: Mar. 15, 2007

(65) Prior Publication Data

US 2008/0169436 A1    Jul. 17, 2008

Related U.S. Application Data

(60) Provisional application No. 60/884,595, filed on Jan. 11, 2007.

(51) Int. Cl.
*G01J 3/10* (2006.01)

(52) U.S. Cl. .............. 250/492.22; 250/396 R; 250/492.23; 250/397; 250/492.3

(58) Field of Classification Search ............ 250/396 R, 250/397, 492.21, 492.3
See application file for complete search history.

(56) References Cited

U.S. PATENT DOCUMENTS

| 4,460,831 | A | 7/1984 | Oettinger et al. | |
|---|---|---|---|---|
| 5,684,360 | A | 11/1997 | Baum et al. | |
| 6,376,985 | B2 * | 4/2002 | Lee et al. | 313/542 |
| 6,724,002 | B2 * | 4/2004 | Mankos et al. | 250/492.24 |
| 6,870,172 | B1 | 3/2005 | Mankos et al. | |
| 2005/0264148 | A1 | 12/2005 | Maldonado | |

FOREIGN PATENT DOCUMENTS

| EP | 1617290 A | 1/2008 |
|---|---|---|
| WO | WO 01/26134 A | 4/2001 |

OTHER PUBLICATIONS

Partial International Search Report mailed Jul. 9, 2008 in corresponding PCT application PCT/US2008/050913.
Pei et al, "Thin-Film Gated Photocathodes for Electron-Beam Lithography," Journal of Vacuum Science & Technology B: Microelectronics Processing and Phenomena, American Vacuum Society, New York, NY, vol. 17, No. 6, Nov. 1, 1999, pp. 2814-2818.
International Search Report dated Oct. 6, 2008 in PCT Application No. PCT/US2008/050913.
Written Opinion dated Oct. 6, 2008 in PCT Application No. PCT/US2008/050913.

* cited by examiner

*Primary Examiner*—David A Vanore
(74) *Attorney, Agent, or Firm*—Suiter Swantz pc llo

(57) ABSTRACT

Embodiments of the invention include an electron beam lithography device using a dynamically controllable photocathode capable of producing a patterned electron beam. One such implementation includes a dynamic pattern generator configurable to produce an electron beam having a desired image pattern impressed thereon. Such an electron beam pattern being enabled by selectively activating programmable photoemissive elements of the pattern generator. The apparatus further including an illumination source arranged to direct a light beam onto the dynamic pattern generator to produce the electron beam having the desired pattern. The electron beam being directed through associated electron optics configured to receive the electron beam from the dynamic pattern generator and direct the electron beam onto a target substrate mounted on a stage.

14 Claims, 4 Drawing Sheets

ELECTRON BEAM LITHOGRAPHY METHOD AND APPARATUS USING A DYNAMICALLY CONTROLLED PHOTOCATHODE

CROSS REFERENCE TO RELATED PATENT APPLICATION

This application is related to, and claims priority from, Application No. 60/884,595, entitled "Electron Beam Lithography Method and Apparatus Using a Dynamically Controlled Photocathode", by Allen M. Carroll, filed Jan. 11, 2007, which is herein incorporated by reference in its entirety.

TECHNICAL FIELD

The invention described herein relates generally to methods and apparatus for projecting a patterned electron beam onto a target substrate. The patterned electron beam enables the transfer of a selected pattern to a surface of a target substrate. Particularly, the invention refers to embodiments wherein the patterned electron beam is generated by an illuminated dynamically controlled pattern generator having an array of addressable and selectively actuatable electron emitting elements formed thereon.

BACKGROUND

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used to produce accurately controllable patterns for many uses, but find particular utility in mask making. Electron beam lithographic systems may be categorized as electron-beam probe focused lithography systems and electron beam projection lithography systems.

In scanning-type lithography (one example of a probe system), the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. Scanning e-beam lithography is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous in that the process is very time-consuming, due to the sequential, point-wise writing. Scanning e-beam lithography is therefore at present mainly used for the production of the masks used in projection lithography.

Recently, advances in electron optical systems have uncovered some newer approaches useful for performing electron beam lithography. One new approach is referred to as reflected electron beam lithography (REBL). An example of this approach is disclosed in detail in U.S. Pat. No. 6,870,172 to Mankos et al., entitled "Maskless Reflection Electron Beam Projection Lithography".

FIG. 1 illustrates schematically how this approach works. An electron source (for example a thermionic emitter, or some other suitable electron emitter) 101 produces a beam of electrons 102 at a bias of 50 kV. The beam of electrons 102 is directed through illumination "optics" configured as electron-optics 104 for receiving and collimating the electron beam 102 from the source 101. Commonly, the illumination optics 104 require an arrangement of magnetic and/or electrostatic lenses configured to focus the electrons into electron beam 102 that is directed into a "magnetic prism" 106 that redirects the electron beam through objective optics 110 onto a electron beam pattern selector 112.

The magnetic prism 106 is a structure for deflecting the electron beam 102 in a direction perpendicular to its initial trajectory so that it is bent towards the objective lens 110 and the electron beam pattern selector 112. Commonly this is effectuated by using magnetic fields (obtained with magnetized plates, specialized windings, and pole pieces and the like) arranged to deviate the electron beam in the desired direction. Unfortunately, such magnetic prisms force electron beams along electron paths that can be of on the order of a meter or more in length. Such long path lengths are capable of seriously degrading the electron beam 102 and are not desirable.

The objective optics 110 generally include magnetic or electrostatic elements configured to decelerate electrons of the beam as they approach the electron beam pattern generator 112. The electron beam 102 is directed onto the electron beam pattern generator 112 that is configured to include an array of addressable elements or contacts. The array generally comprises an array of dynamically addressable metal contacts. This array can comprise an array of several million contacts if desired. A voltage level is controllably applied to the contacts to selectively reflect the electrons of the electron beam. For example, in areas of the pattern where no electrons are required, a positive bias can be applied to the metal contacts to absorb electrons and a negative bias can be applied to "reflect" the electrons away from selected contacts of the selector 112. Thus, by controlling the a pattern of voltages across the contacts of the electron beam pattern generator 112, the pattern of the reflected electron beam 113 can also be controlled.

As the reflected electrons 113 leave the selector 112, the objective optics accelerate the reflected electrons 113 toward their second pass through the prism 106. The prism 106 bends path of the reflected electrons 113 towards the projection optics 114.

The projection electron-optics 114 reside between the prism 106 and the target 116 (typically mounted on a movable stage). The projection optics 114 are typically configured to demagnify the beam 113 and focus the electron beam 113 onto a photoresist layer of a target (e.g., a wafer or mask). In this fashion, a desired pattern can be transferred onto the target (e.g., a layer of photoresist).

Although such processes and tools are suitable for their intended purposes, improvements can be made. The present invention seeks to go beyond the limitations and structural shortcomings of this existing technology.

SUMMARY OF THE INVENTION

In accordance with the principles of the present invention, an improved electron beam lithography tool and methods for its use are disclosed.

In general, the present invention is directed toward apparatus and associated method of photonically generating an electron beam having a desired image pattern impressed thereon and directing the patterned electron beam directly onto a target substrate using electron optics.

One embodiment of the invention comprises an apparatus having a dynamic pattern generator configured to produce an electron beam having a desired pattern. The apparatus includes an illumination source for directing a light beam onto the dynamic pattern generator to produce the electron beam having the desired pattern. The patterned electron beam is directed through electron optics configured to receive the electron beam and direct the electron beam onto a target substrate mounted on a stage for holding the target substrate.

In another apparatus embodiment, a dynamic pattern generator is again configured to produce an electron beam having a desired pattern when illuminated by a light beam. The apparatus includes an illumination source for directing a light beam onto a reflective element which is positioned to reflect the light onto the dynamic pattern generator which then produces an electron beam having the desired pattern. The patterned electron beam is directed through electron optics configured to receive the electron beam and direct the electron beam onto a target substrate mounted on a stage for holding the target substrate.

In another method embodiment, the invention involves the operations of providing a dynamically programmable photoemissive source having an array of addressable photoemissive elements that can be selectively activated to generate a patterned electron beam. The photoemissive source is programmed by activating selected ones of the addressable photoemissive elements to configure the photoemissive source for emission of a patterned electron beam having a desired pattern. The configured photoemissive source is illuminated with a photon beam causing the source to produce a patterned electron beam that is directed onto a target substrate.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which.

It is to be understood that in the drawings like reference numerals designate like structural elements. Also, it is understood that the depictions in the Figures are not necessarily to scale.

DETAILED DESCRIPTION OF THE INVENTION

Figure 1:
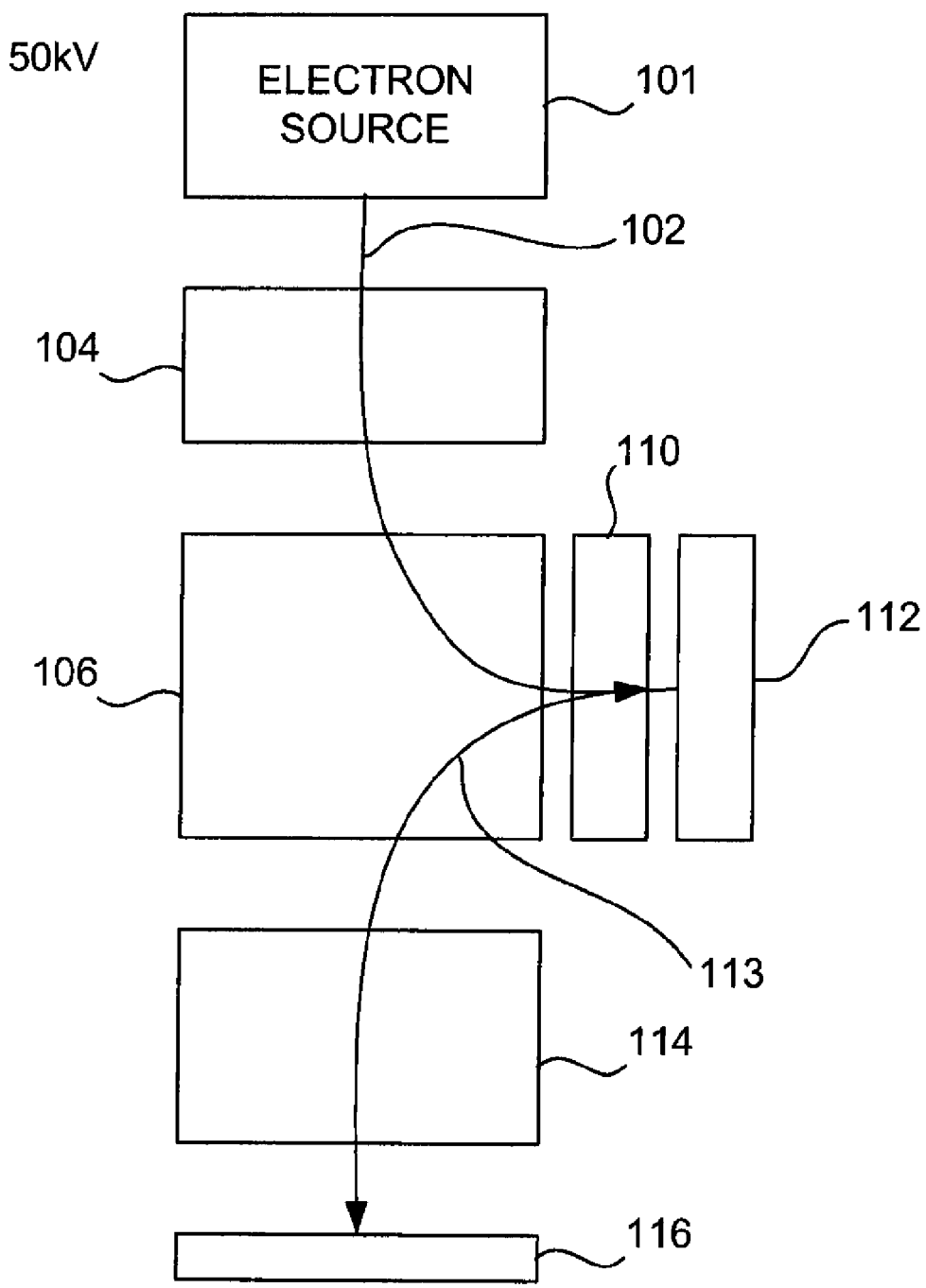
FIG. 1 illustrates a prior art approach toward creating a reflected electron beam device.

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In general, the present invention encompasses maskless electron beam projection lithography apparatus and methods for their use in generating patterned targets which can include, but are not limited to, semiconductor wafers and masks, as well as other surfaces capable of pattern transfer with an electron beam.

As discussed above, electron-beam direct write (REBL) lithography has the potential to achieve excellent resolution and a reasonable throughput. However, certain limitations are present in the known implementations of that technology. First is the need to generate an electron beam that is directed through a number of beam modulating elements including an electron prism. This results in a large and complex device. Second, the electron beam path lengths are long (typically in excess of a meter) and accordingly, increase the severity of electron-electron interactions in the electron beam. As a consequence the electron beam and the image pattern contained can be seriously degraded. Additionally, the process chambers required in the prior art processes are quite large, necessitating large vacuum chambers having to be maintained at very high levels of vacuum, further adding to the complexity of the device.

Thus, it would be advantageous to remove the electron prism from the apparatus entirely if possible and shorten the electron path if possible. By removing the electron prism a smaller, less complex, and lower cost apparatus may be constructed. Additionally, a shorter electron beam path length reduces the incidence of unwanted electron-electron interactions before the electron beam hits the target. Additionally, such simplified machines will demonstrate lower long-term maintenance costs due to the reduced complexity.

Additionally, a patterned e-beam tool of the type suggested by the inventors here should have a high throughput relative to standard scanning e-beam devices such as are currently in widespread use in the mask fabrication industry.

The invention disclosed here demonstrates many improvements over the state of the art and satisfies many of the needs in the industry as expressed in the foregoing paragraphs.

Accordingly, this patent discloses a system and method of electron beam lithography that overcomes many of the above-discussed disadvantages and problems. Rather than focusing the electron beam into a tiny spot, the approach described herein floods the target with an image patterned electron beam that can expose a large portion of a target with an image pattern thereby transferring a desired image to the target. By enabling larger portions of the target surface to be imaged at one time such a method and device presents a solution to many throughput issues that are problematic in the industry. For example, in one implementation an area roughly 0.2 millimeters (mm) by 0.010 mm may be illuminated. The inventor points out that this is merely an example with many different beam sizes being possible. That area is several orders of magnitude larger than a traditional e-beam system that focuses the beam into a much smaller spot sizes (e.g., spot sizes that are tens of nanometers (nm) wide). Additionally, the device taught here is simpler, more compact, and demonstrates superior operating characteristics relative to existing e-beam technologies.

One generalized embodiment described here features a photonic light beam directed onto a dynamic pattern generator (also referred to a pattern selector) capable of emitting a pattern of electrons from an array of selectively activatable contacts to generate an electron beam having image data contained therein and directing the electron beam onto a suitable target substrate for image transfer. By the mechanisms described herein patterned image data can be embodied in an electron beam which is then diredeted onto a target substrate where pattern transfer can be effectuated if desired.

The systems and methods disclosed herein do not require redirection of electron beams onto pattern generators where the electron beams are reconfigured and then cleverly redirected out of a direct line of sight onto a wafer, as do the methodologies known in the art. Here, embodiments of the invention use direct photon illumination of a programmable electron emitting source to produce a patterned electron beam that carries image data onto a target. The inventive approach described herein uses a photon beam that is directed onto a specially configured dynamically patternable photoemissive cathode that is configured to receive the photonic illumination and generate a controllable patterned electron beam in response. This electron beam can then be directed through any necessary optics (e.g., focusing, collimation, demagnification, and so on) and then onto the target where a specific pattern is transferred according to the data contained in the patterned electron beam. As an added benefit, because the present invention dispenses with the prior art electron prism, the electron beam path lengths between the emitter and target can be very short in comparison with the known technologies. This reduces the incidence of unwanted electron-electron interactions within the electron beam.

In a generalized description of one particularly useful embodiment of the invention, photons are directed onto a programmable electron emitting source (also referred to herein as a dynamic pattern generator (DPG)) that has an array of independently addressable and controllable electron emission cells which can be selectively activated/deactivated to produce an electron beam that contains a pattern of image data. Independently-controllable voltages are applied to cells of the dynamic pattern generator array to regulate the level of electron emission at each cell on the DPG. Such a device can be implemented using integrated circuit technology. In one implementation, voltage levels at each cell (contact) can be used to determine whether the cell emits electrons that become part of the patterned electron beam or whether a cell absorbs emitted electrons (or does not emit the electrons at all). The detail of such a pattern can be very fine. For example, a typical contact array is determined by the size of the array formed and the size of the contacts used. For example, in one embodiment, four million contacts may be exposed using a 4000×1000 array of individually addressable elements. This may be achieved using standard IC fabrication techniques. The inventors point out that very small elements can be formed (on the order of 1 μm square or less depending on the level of fabrication precision desired) in very large arrays covering whole semiconductor chips if desired. Additionally, the imaging optics can be used to de-magnify the beam in order to achieve much smaller sizes at the target (e.g., wafer).

Figure 2:
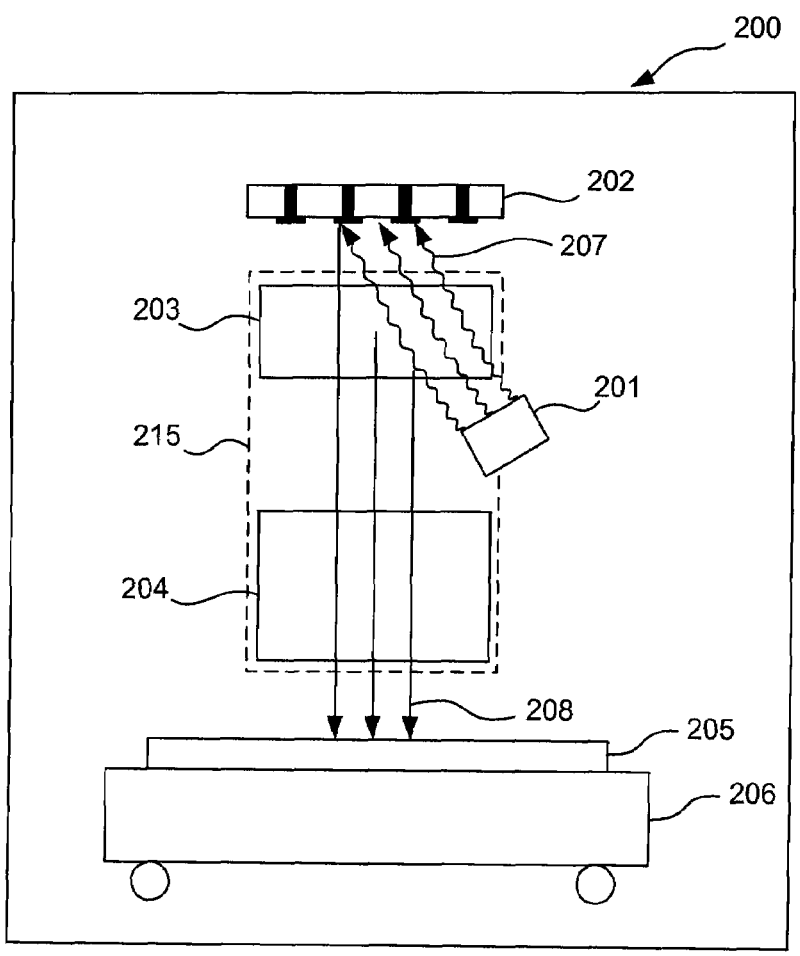
FIG. 2 is a simplified block diagram illustrating aspects of a photoemissive electron beam lithography device using a dynamically controlled photo cathode in accordance with one embodiment of the present invention.

FIG. 2 is a simplified schematic diagram of a maskless electron beam projection lithography system 200 in accordance with an embodiment of the invention. As depicted, the system 200 includes a light source 201, a dynamic pattern generator (DPG) 202, an imaging system 215 (for example, including objective electron-optics system 203 and projection electron-optics system 204), and a stage 206 for holding a wafer or other target 205 to be lithographically patterned. In accordance with an embodiment of the invention, the various components of the system 200 may be implemented as follows.

The illumination source 201 may be implemented to supply large doses of photons. Generally, the source 201 will be a high energy UV source, although other wavelengths and sources are contemplated by the inventor. For example, a frequency quadrupled YAG laser is suitable. Although lasers are particularly suitable photonic illumination sources (for reasons discussed herein), the invention is not limited to lasers and can include a wide range of photon producing devices. Standard high intensity lamps may be used, as can bandwidth filtered lamps. Examples of such include, but are not limited to, mercury lamps, xenon lamps and other high power lamps known to those having ordinary skill in the art.

The imaging system 215 is generally a reduction imaging system. This system is electron optics capable of, among other things, focusing and demagnifying the electron beam 208 of the system. The electron-optics used are configured to receive and collimate the electron beam 208 and may comprise an arrangement of magnetic and/or electrostatic lenses configured to demagnify and focus the pattern electron beam 208 onto the target 205. The specific details of the arrangement of lenses depend on specific parameters of the apparatus and may be determined by one of skill in the pertinent art.

In one embodiment, the imaging system includes an objective system 203 and a projection system 204 each configured as electron optics. Because the objective 203 and projection 204 optic systems are electron optics (i.e., using magnetic or electrical fields to influence the electron beams) the illumination beam 207 can pass through these optic systems without effect. Thus, there is some degree of positioning flexibility for the illumination system 201. In the depicted embodiment, the illumination system 201 is located between the objective system 203 and the projection optics 204, but could have just as well be located elsewhere (e.g., under the projection optics for example). It is necessary that the illumination system 201 be positioned to enable an unobstructed line-of-sight illumination path to the DPG and that the source not be in the path of the electron beam 208.

As indicated above, lasers are particularly suitable illumination sources due to the high intensity beams produced and the narrow wavelength bandwidth of produced photons. This results in a narrow bandwidth of energy in the produced electrons (producing a so-called low energy spread) which can be advantageous in some implementations. Once the light from the source 201 impinges on the pattern generator 202 a mass of electrons is emitted or otherwise produced. The system 200 controls the wavelength of the incident beam such that the energy is only slightly larger than the work function of the electrode material. The wavelength is chosen such that the produced electrons have a relatively low range of kinetic energy. In on example, the DPG 202 should be illuminated such that the energy spread of the emitted electrons was less than 0.5 electron volts (eV). Additionally, the source electrode material may be preferably selected to be a material in which impurities are unlikely to deposit or migrate to the surface and degrade or choke off emission. For example, suitable materials include, but are not limited to noble metals such as, palladium and platinum. Additionally, a high degree of vacuum in the system can be used to overcome such impurity problems. Systems operating in accordance with the principles of the invention should operate at a vacuum of at least $10^{-6}$ Torr. Additionally, vacuums in excess of $10^{31\ 9}$ can be used to provide better results.

Figure 3:
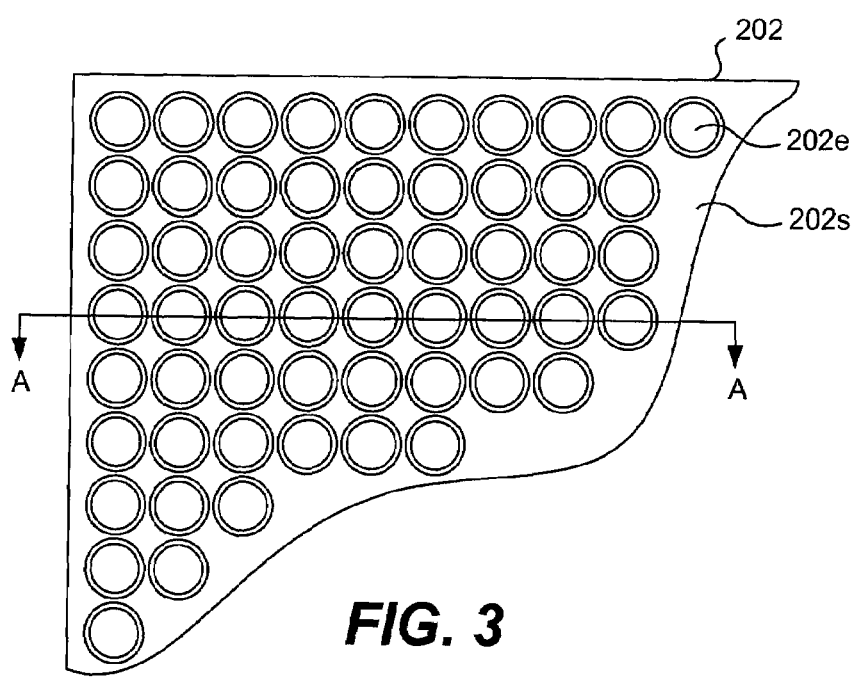
FIG. 3 is simplified plan view of a portion of the array of photoemissive cells of a controllable dynamic pattern generator (DPG) in accordance with one embodiment of the present invention.

FIG. 3 is a simplified top down view of a portion of a dynamic pattern generator 202 constructed in accordance with the principles of the invention. The DPG 202 comprises an array of photoemissive contacts 202e. The contacts 202e include a contact to which a voltage level is controllably applied to control the electron production from that portion of the array. Additionally, the DPG includes a relatively large conductive surface 202s that does not function as a photoemissive source (e.g., polysilicon or other conductive materials that are poor photoemitters can be used). A uniform constant voltage is applied to the conductive surface 202s Although shown here with constant voltage of 0 V, the inventors contemplate that other voltage levels can be applied. By controlling the voltage at each electrode the electrons can either be produced or not in a localized and controllable fashion. The principles of operation of the DPG 202 are briefly described below.

Returning again to FIG. 2, once the desired mass of electrons is produced, the desired pattern of electrons is directed through optical systems and onto a target substrate. For example, an extraction portion of the objective lens 203 can be used to provide an extraction field in front of the DPG 202. As the produced electrons 208 leave the DPG 202, the objective optics 203 accelerate the produced electrons 208 toward the projection optics system 204 and the target 205.

The projection electron-optics 204 reside between objective lens and the wafer stage 206. Projection optics 204 focus the electron beam and demagnify the beam onto photoresist on a wafer or other target. A demagnification range of from 1× to 50× (i.e., 1× to 0.02× magnification) is typical. It is desirable that the blur and distortion due to the projection optics 204 are genrally less than about two times the pixel size. A "pixel" being the demagnified light (or dark) spot produced by each of the contacts in a patterned array. In one implementation, the pixel size may be, for example, 22.5 nanometers (nm). In such a case, the projection optics 204 is preferably constructed so that aberrations and distortions caused by the system are less than about 45 nm.

The wafer stage 206 holds the target 205. In one embodiment, the stage 206 can be stationary during the lithographic projection. In another embodiment, the stage 206 is in linear motion during the lithographic projection. In alternative embodiments, the stage 206 enables a rotary or spiral target motion during the lithographic projection. In the case where the stage 206 is moving, the pattern on the DPG 202 may be dynamically adjusted to compensate for the motion such that the projected pattern moves in correspondence with the wafer movement. In other embodiments, the inventive system 200 may be applied to other targets besides semiconductor wafers. In one particularly pertinent example, the system 200 may be applied to mask reticles. As is known to those having ordinary skill in the art, the reticle manufacturing process is similar to the process by which a single integrated circuit layer is manufactured on a substrate.

Figure 4A:
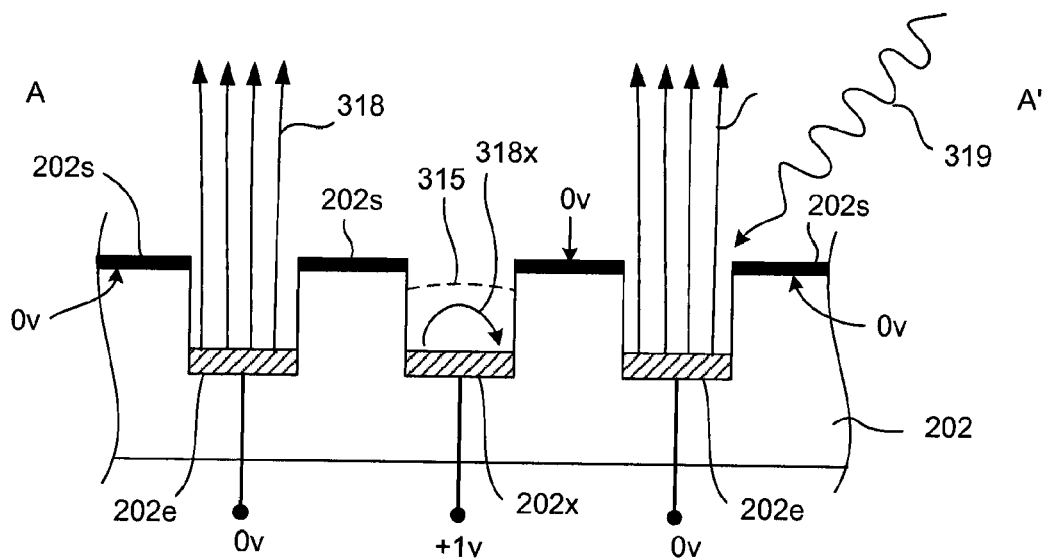
FIGS. 4A and 4B present two simplified cross-sectional depictions of a DPG showing the operation of the photoemissive cells in accordance with the principles of the invention.

FIG. 4A is a simplified example of one portion of a cross-section view taken along the A-A section line of FIG. 3. The depicted simplified embodiment shows the operation of an illuminated dynamic pattern generator in accordance with an embodiment of the invention. In one implementation the DPG can be an integrated circuit having a portion of its surface configured as an array of individually addressable photoemissive cells formed in a substrate. The individually addressable photoemissive cells can be formed using any standard IC fabrication techniques known to those having ordinary skill in the art. Additionally, the substrate is typically (but not necessarily) comprised of dielectric materials that do not emit electrons strongly when illuminated (e.g., $SiO_2$ and other dielectric materials). The photoemissive cells are configured such that they can emit electrons when illuminated by a suitable beam of photons. The cells can include an emitter electrode that has a photoemissive surface formed of any material that emits electrons when illuminated by photons of a suitable frequency. Metals are particularly suitable photoemissive materials (electron producers) useful in this role as are some semiconductors. In one typical example, an emitter electrode (and its associated contact circuitry) can be formed of copper or any other conductive material with the face of the electrode coated with a photoemissive material. In one example, the electrodes are formed of copper or aluminum as these are particularly common IC fabrication materials. Additionally, to prevent oxidation, corrosion, or other effects that will change the properties of the electrodes over time, the electrodes can be coated with a noble metal such as palladium or platinum or other relatively unreactive materials (that are photoemissive) if desired. The cells can be formed of a wide range of sizes. In a few typical embodiments, cells ranging from about 800 nm on a side to about 4 µm on a side are used. The inventors contemplate that many other sizes can be used if desired. In addition, the surface includes a common control electrode (i.e., 202s) that is not a photoemitter at the illumination wavelengths used.

Continuing with a discussion of FIG. 4A, each emitter electrode 202e, 202x includes a conductive and photoemissive face. A controlled voltage level is applied to each contact. In the example illustrated in FIG. 4, four of the contacts 202e are "on" and have voltages applied such that electrons 318 will be propelled away from the DPG. While another contact 202x is "off" and has voltage applied to absorb (or not emit) electrons. The specific voltages may vary depending on the parameters of the system. In this example, the electrons 318 produced by illumination 319 of the DPG 202 are propelled away from each of the "on" contacts. Electrons 318x are either not produced or are reabsorbed by the "off" contact 202x. The regions above the "on" electrodes 202e define equipotential volumes arranged so that the photoelectrons 318 produced at the electrodes 202e are free to escape into the space above the DPG to enter the associated electron-optical system which directs the electrons onto the desired target. However, in the volumes directly above the "off" electrodes (e.g., 202x) the electric field created by the potential difference between the surface electrode 202s and the off electrode 202x retards the photoemitted electrons. In one example, dashed line 315 represents an approximate 0.5V equipotential surface. Thus, photoelectrons emitted at 202x having a kinetic energy of less than 0.5V do not cross the surface 315 and thus do not become part of the electron flow (defined by 318) and are reabsorbed by the "off" electrode 202x. Additionally, electrons that are not reabsorbed build up a space charge in the volume above the electrode 202x which can also inhibit further photoemission. Thus, photoelectrons do not emanate from the portions of the DPG characterized by "off" electrodes 202x and thus do not enter into the resultant electron beam pattern. Thus, by selectively activating or deactivating the contacts, an entire patterned electron beam can be formed having a desired image pattern formed therein. Accordingly, this patterned beam is directed onto an imagable substrate. For example, the pattern can be projected onto a photoresist layer by exposing the layer to the patterned beam to transfer the pattern to the photoresist. In this way, the pattern imprinted on the patterned electron beam is transferred onto a photoresist layer formed on the surface of the target substrate. As is known to those having ordinary skill in the art, subsequent development and processing can be used to further effectuate pattern transfer.

Figure 4B:
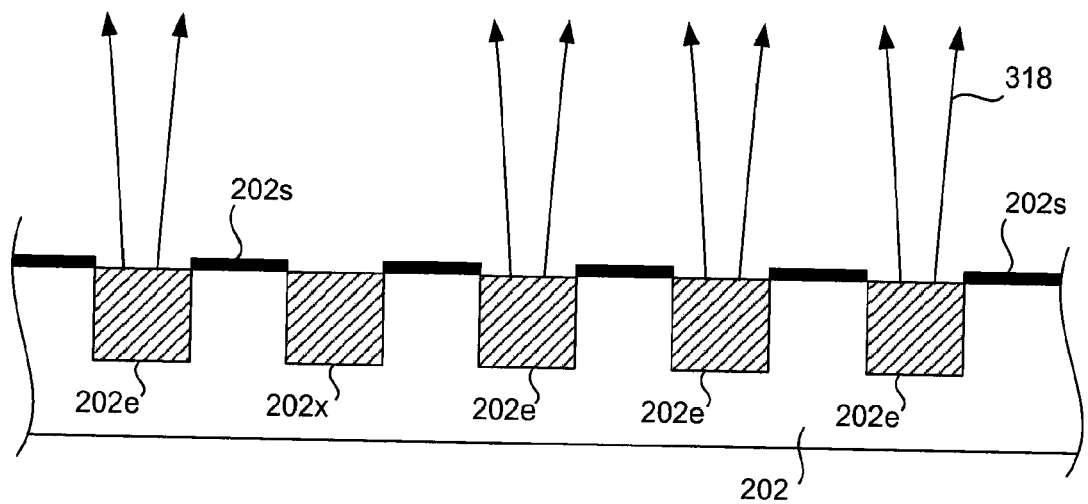

Referring now to an alternative embodiment depicted in FIG. 4B, the inventors disclose another type of emitter electrode configuration. The simplified depiction of the embodiment shown here includes "controllable" emitter electrodes 202e, 202x that can be used to selectively control photoemission. Here, the photo emissive electrodes 202e and 202x represent so-called P/N junctions that can be used much like diodes to control the work function of the emitter electrodes (202e, 202x). These P/N photoemissive electrodes can be formed by selectively doping the substrate 202 in any of a number of methods known to those having ordinary skill in the art. The emitters (202e, 202x) in operation are arranged such that when electron emission is required the electrode 202e a small forward bias is formed between the emitting electrode 202e and the common electrode 202s. Conversely, a pull or slightly reversed bias can be applied between the non-emitting electrode 202x and the common electrode 202s to retard electron formation. The application of a zero or slightly reversed bias between 202s and 202x is thought to deplete the supply of mobile charge carriers in the electrode 202x, thereby preventing the emission of photoelectrons. This functions as if the work function of the electrode materials (202e, 202x) was controlled. For example, because the "work function" is the energy difference between the electron states at the Fermi level in the material and the electron states in the continuum in the vacuum above the electrode, depleting the supply of charge carriers effectively reduces the Fermi energy and accordingly increases the work function.

Additionally, as described above, the DPG 202 comprises a programmable pattern generator structure. In an alternate embodiment, the system may utilize a static patterned structure. As described above, the DPG 202 is utilized to generate a pattern with contacts either on or off. In an alternate embodiment, gray scale values for the contacts may be implemented. Gray scale values may be implemented, for example, by using a finer range of voltage values so as to provide control over the percentage (between 0% and 100%) of electrons produced by a contact. Alternatively, gray scale values may be implemented by varying the percentage of time over which each contact remains on.

Figure 5:
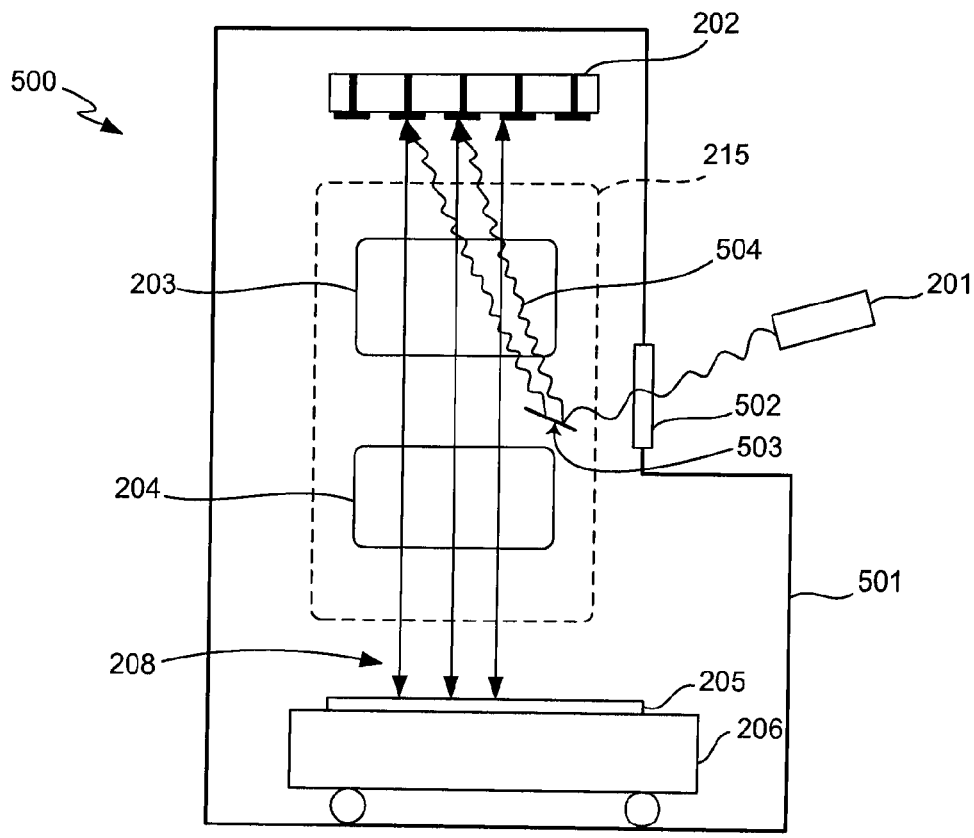
FIG. 5 is a simplified block diagram illustrating another embodiment of an electron beam lithography device using a dynamically controlled photo cathode in accordance with the present invention.

FIG. 5 is a simplified depiction of another embodiment of a maskless electron beam projection lithography system 500 of the invention. This embodiment is similar to the embodiment depicted in FIG. 3 with some small differentiations. In many cases the environmental conditions of the lithography process are not compatible with the presence of an illumination source. This is especially the case where the process environment may degrade the illumination source or the presence of the source affects the process environment. In such a case a remote illumination source can be mounted external to a process chamber and a light beam directed into the chamber onto the DPG.

The example embodiment 500 depicted here includes a vacuum chamber 501 into which most of the components can be mounted. This includes a dynamic pattern generator (DPG) 202, an imaging system 215 (for example, including objective electron-optics system 203 and projection electron-optics system 204), and a stage 206 for holding a wafer or other target 205 to be lithographically patterned. An externally mounted illumination source 201 can be directed through an optically transmissive window 502 and onto a suitable positioned reflector 503 to enable a light beam to be directed onto the DPG 202. In accordance with an embodiment of the invention, the various components of the system 500 may be implemented as follows.

The illumination source 201 is as described, for example, with respect to FIG. 2 and elsewhere in this patent. As before, although lasers are particularly suitable illumination sources, the invention is not limited to lasers and can include a wide range of photon producing devices. The illumination source directs a photon beam onto the reflector 503 (in this case by passing through the optically transmissive window 502) which is arranged and configured to reflect the photons 504 onto the DPG 202 which is configured to generate a desired electron image pattern. The patterned electron beam 208 is then directed into the illumination optics 215.

The imaging system 215 is generally a reduction imaging system. As before, the system is constructed of electron optics capable of, among other things, focusing and demagnifying the electron beam 208 of the system. The specific details of the arrangement of lenses depend on specific parameters of the apparatus and may be determined by one of skill in the pertinent art. In the depicted embodiment, the imaging system 215 includes an objective electron optic system 203 and a projection electron optic system 204. Also as before, because the objective 203 and projection 204 optic systems are electron optics the illumination beam 504 can pass through these optic systems without effect. Thus, there is a great degree of freedom in positioning the illumination system 201 and the reflector 503. The critical criteria being that the reflector 503 not be in the path of the electron beam 208. The system is generally configured such that the target 205 is at a low potential (e.g. 0 volts) and the DPG 202 or the illumination optics 215 at a high voltage (e.g., −50 kV). Essentially, this embodiments operates in all other manners like the previously described embodiments.

Figure 6:
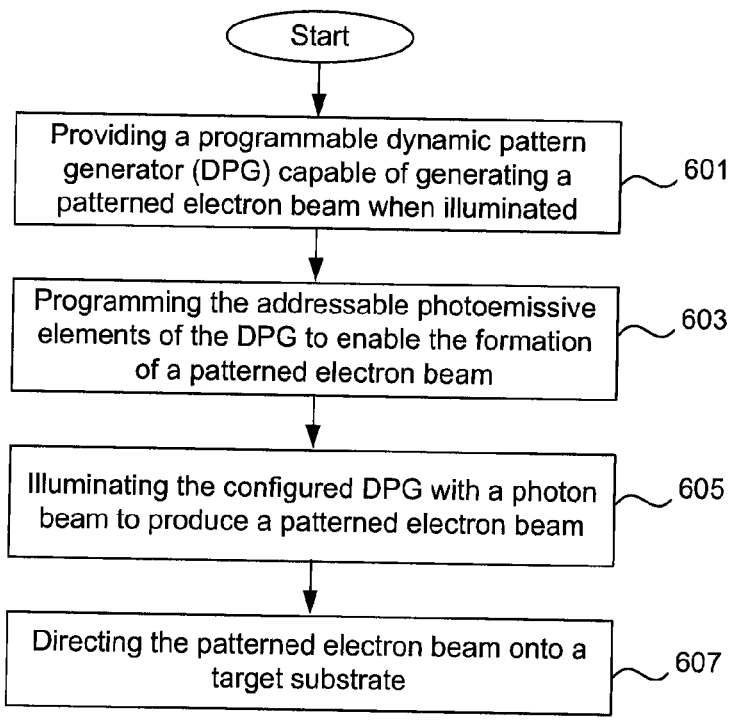
FIG. 6 is a simplified flow diagram describing some aspects of a method implementation in accordance with the principles of the invention.

FIG. 6 depicts a simplified schematic flow diagram that illustrates an implementation embodiment in accordance with the principles of the invention. In such an implementation the apparatus' such as described herein can be used in accordance with the following method to achieve e-beam pattern transfer onto a substrate or to generate pattern e-beams. Such a method involves the following simplified operations. A programmable dynamic pattern generator (DPG) having a plurality of addressable photoemissive elements is provided (Step 601). An example of a DPG is well described herein. This DPG is specifically configured to enable the generation of a patterned electron beam when illuminated. The addressable photoemissive elements of the DPG are then programmed into a predetermined pattern configured to enable the generation of a desired electron beam pattern upon illumination (Step 603). As explained above, this typically involves selectively setting the addressable elements in an "on" or "off" mode. Or alternatively grey scaling the elements with some intermediate setting. The configured DPG is illuminated with a photon beam to produce a patterned electron beam having the desired image pattern (Step 605). As described above, the illumination can be provided with a laser, a filtered broadband source, or a number of other photon sources. It is also explained that sources producing a narrow energy range for the emitted electrons are useful. Once the patterned electron beam is produced it is directed onto the target substrate (Step 607). Typically, the target comprises a photoresist layer on a substrate where a pattern transfer can be effectuated.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that many different device arrangements and configurations can be established for photocathode electron beam lithography devices constructed in accordance with the principles of the invention. Although only a few configurations are expressly disclosed herein, it should be appreciated by anyone having ordinary skill in the art that, using the teachings disclosed herein, many different configurations can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element that is not specifically disclosed herein.

I claim:

1. An apparatus for electron beam lithography, the apparatus comprising:
    a dynamic pattern generator configured to produce an electron beam having a desired pattern, where the dynamic pattern generator has an array of independently addressable and controllable electron emission cells that are selectively activated, where an independently controllable voltage is applied to each electron emission cell of the dynamic pattern generator;
    an illumination source arranged to direct a light beam onto the dynamic pattern generator enabling the pattern generator to produce the electron beam having the desired pattern;
    a stage for holding a target substrate;
    electron optics configured to receive the electron beam from the dynamic pattern generator and direct the electron beam onto the target substrate.

2. An apparatus as claimed in claim 1, wherein the dynamic pattern
    generator, illumination source, target substrate, stage, and electron optics are all
    arranged within a vacuum chamber capable of reaching a vacuum of at least $10^6$ Torr.

3. An apparatus as claimed in claim 1, wherein the dynamic pattern
    generator, illumination source, target substrate, stage, and electron optics are all
    arranged within a vacuum chamber capable of reaching a vacuum of at least $10^9$ Torr.

4. An apparatus as claimed in claim 1, wherein the apparatus further includes a reflector arranged to reflect the light beam onto the dynamic pattern generator.

5. An apparatus as claimed in claim 4, wherein the dynamic pattern generator, reflector, target substrate, stage, and electron optics are all arranged within a vacuum chamber and wherein the illumination source is arranged outside the vacuum chamber such that the light beam can be directed into the chamber through an optically transmissive window onto the reflector so that the beam can then be directed onto the dynamic pattern generator.

6. An apparatus as claimed in claim 1, wherein the apparatus includes an extraction field configured to accelerate the electrons forming the electron beam toward the electron optics.

7. An apparatus as claimed in claim 1, wherein the electron optics include an objective lens system and a projection lens system.

8. An apparatus as claimed in claim 7, wherein the objective lens system includes an extraction field configured to accelerate the electrons forming the electron beam toward the electron optics.

9. An apparatus as claimed in claim 7, wherein the projection lens system is configured to at least demagnify the electron beam.

10. An apparatus as claimed in claim 1, wherein the dynamic pattern generator comprises an array of addressable electron emission cells that are configurable to controllably and selectively emit electrons enabling the programmable configuration of the electron beam to contain image information including said desired pattern.

11. The apparatus of claim 10, wherein the dynamic pattern generator comprises an array of individually addressable electron emission cells that can be controllably and selectively activated and deactivated to selectively emit electrons from the cells enabling the formation of an electron beam having a desired pattern.

12. The apparatus of claim 10, wherein the controllable and selective activation and deactivation of electron emission cells enables the dynamic pattern generator to selectively modulate the work function of each cell to selectively enhance or suppress the photoemission of electrons from the cells thereby enabling the
    formation of an electron beam having a desired pattern.

13. The apparatus of claim 10, wherein the controllable and selective activation and deactivation of electron emission cells enables the dynamic pattern generator to selectively recapture emitted electrons emitted from each cell to thereby enabling the formation of an electron beam having a desired pattern.

14. The apparatus recited in claim 1 wherein the dynamic pattern generator comprises:
    a substrate having a plurality of controllable photoemissive cells formed therein; and
    a surface electrode formed on top of the substrate, the surface electrode including apertures arranged to enable the light beam to impinge on the plurality of controllable photoemissive cells the material of the surface electrode being electrically conductive but not photoemissive at selected wavelengths of the light beam.

* * * * *